(12) United States Patent
Yan et al.

(10) Patent No.: US 9,484,253 B2
(45) Date of Patent: Nov. 1, 2016

(54) SIGNAL LINE FABRICATION METHOD, ARRAY SUBSTRATE FABRICATION METHOD, ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Changjiang Yan, Beijing (CN); Haizheng Xie, Beijing (CN); Lei Chen, Beijing (CN); Shaoying Xu, Beijing (CN); Zhenyu Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 76 days.

(21) Appl. No.: 14/387,519

(22) PCT Filed: May 20, 2013

(86) PCT No.: PCT/CN2013/075909
§ 371 (c)(1),
(2) Date: Sep. 23, 2014

(87) PCT Pub. No.: WO2014/127589
PCT Pub. Date: Aug. 28, 2014

(65) Prior Publication Data
US 2015/0104937 A1   Apr. 16, 2015

(30) Foreign Application Priority Data

Feb. 22, 2013   (CN) .......................... 2013 1 0056045

(51) Int. Cl.
*H01L 21/768*   (2006.01)
*H01L 29/423*   (2006.01)
*H01L 29/49*   (2006.01)
*H01L 27/12*   (2006.01)

(52) U.S. Cl.
CPC ....... *H01L 21/76865* (2013.01); *H01L 27/124* (2013.01); *H01L 27/1259* (2013.01); *H01L 29/42384* (2013.01); *H01L 29/4908* (2013.01)

(58) Field of Classification Search
CPC ............. H01L 21/02296; H01L 21/70; H01L 21/702; H01L 21/71; H01L 21/76853
See application file for complete search history.

(56) References Cited

U.S. PATENT DOCUMENTS

| | | | | |
|---|---|---|---|---|
| 2001/0028415 | A1* | 10/2001 | Hirabayashi | ...... G02F 1/136204 349/40 |
| 2010/0139391 | A1* | 6/2010 | Sakuma | ................ B81B 3/0072 73/204.26 |
| 2010/0163876 | A1 | 7/2010 | Inoue et al. | |

FOREIGN PATENT DOCUMENTS

| | | |
|---|---|---|
| CN | 101379539 A | 3/2009 |
| CN | 101826457 A | 9/2010 |

OTHER PUBLICATIONS

International Preliminary Report on patentability Appln. No. PCT/CN2013/075909; Dated Aug. 25, 2015.
Third Chinese Office Action Appln. No. 201310056045.6; Dated Feb. 3, 2015.

(Continued)

*Primary Examiner* — Cheung Lee
(74) *Attorney, Agent, or Firm* — Ladas & Parry LLP

(57) ABSTRACT

Embodiments of the disclosure provide a signal line fabrication method, an array substrate fabrication method, an array substrate and a display device. The signal line fabrication method includes: sequentially forming a material layer for forming the signal line, a material layer for forming a first barrier layer and a material layer for forming a second barrier layer; forming the first barrier layer and the second barrier layer by a patterning process; and forming the signal line by a patterning process.

19 Claims, 3 Drawing Sheets

(56) References Cited

OTHER PUBLICATIONS

International Search Report Appln. No. PCT/CN2013/075909; Dated Nov. 28, 2013.

First Chinese Office Action Appln. No. 201310056045.6; Dated May 19, 2014.
Second Chinese Office Action Appln. No. 201210056045.6; Dated Sep. 29, 2014.

* cited by examiner

SIGNAL LINE FABRICATION METHOD, ARRAY SUBSTRATE FABRICATION METHOD, ARRAY SUBSTRATE AND DISPLAY DEVICE

TECHNICAL FIELD

Embodiments of the disclosure relate to a signal line fabrication method, an array substrate fabrication method, an array substrate and a display device.

BACKGROUND

Currently, Thin Film Transistor-Liquid Crystal Display (TFT-LCD) occupies a dominant position in the display market. In the TFT-LCD, image display is implemented by controlling a gray-scale voltage applied to a pixel electrode of each sub-pixel. That is, when an ON voltage is applied to a gate line of a certain row, Thin Film Transistor (TFT) connected with this gate line is turned on, the gray-scale voltage transmitted in a data line is input to the pixel electrode of the sub-pixel, and a voltage difference between the pixel electrode of the sub-pixel and a common electrode determines a deflection state of liquid crystal molecules so as to adjust brightness and display effect of the liquid crystal display.

Typically, the TFT-LCD includes an array substrate, an opposite substrate, and a liquid crystal layer filled between the array substrate and the opposite substrate.

FIG. 1 is a structural schematic view illustrating an array substrate according to one technique. As shown in FIG. 1, the array substrate successively comprises from bottom to top: a glass substrate 11, a gate electrode 12 and a gate line (not shown) disposed in a same layer with the gate electrode 12, a gate insulation layer 13, an active layer 14, a source electrode 15, a drain electrode 16, a data line (not shown) disposed in a same layer with the source electrode 15 and the drain electrode 16, a passivation layer 17 and a pixel electrode 18. The gate electrode 12 partially overlaps with the source electrode 15 and the drain electrode 16, and such overlapping portion results in a coupling capacitance between the gate electrode 12 and the source and drain electrodes 15 and 16, thus a transmission speed of the active layer 14 is decreased.

SUMMARY

According to embodiments of the disclosure, a signal line fabrication method is provided. The method comprises: sequentially forming a material layer for forming the signal line, a material layer for forming a first barrier layer and a material layer for forming a second barrier layer; forming the first barrier layer and the second barrier layer by a patterning process; and forming the signal line by a patterning process.

According to embodiments of the disclosure, an array substrate fabrication method is provided. The array substrate fabrication method comprises forming a signal line, and the signal line is formed by the above-described signal line fabrication method.

According to embodiments of the disclosure, an array substrate is provided. The array substrate comprises a signal line, a first barrier layer provided on the signal line and a second barrier layer provided on the first barrier layer.

According to embodiments of the disclosure, a display device is provided. The display device comprises the above-described array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

Figure 1:
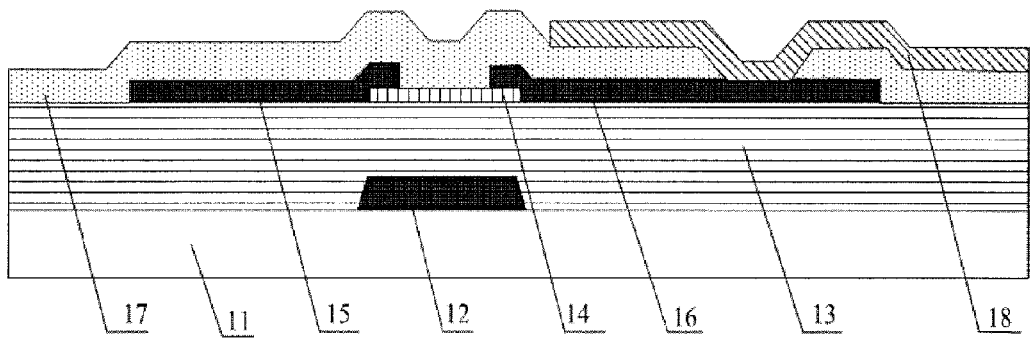
FIG. 1 is a structural schematic view illustrating an array substrate according to one technique.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiments of the disclosure provide a signal line fabrication method. The signal line fabrication method comprises:

sequentially forming a material layer for forming the signal line, a material layer for forming a first barrier layer and a material layer for forming a second barrier layer, wherein under a same etching condition, a lateral etching speed of the material layer for forming the first barrier layer is greater than a lateral etching speed of the material layer for forming the second barrier layer;

etching the material layer for forming the first barrier layer and the material layer for forming the second barrier layer by an etching process, to obtain the first barrier layer and the second barrier layer; and etching the material layer for forming the signal line by an etching process to obtain the signal line.

The signal line is any wiring for transmitting a signal. For example, the signal line is a gate electrode of a thin film transistor, a data line, a gate line, and a common electrode line, etc.

For example, the material layer for forming the signal line, the material layer for forming the first barrier layer and the material layer for forming the second barrier layer are formed sequentially by a deposition method.

For example, the material layer for forming the first barrier layer and the material layer for forming the second barrier layer are etched by a dry etching method.

For example, the material layer for forming the signal line is etched by a wet etching method.

Embodiments of the disclosure further provide an array substrate fabrication method. The array substrate fabrication method comprises the above-described steps of the signal line fabrication method.

The array substrate includes a thin film transistor, a gate line and a data line, the thin film transistor is provided at an intersection of the gate line and the data line. For example, the signal line is a gate electrode of the thin film transistor, the gate line or the data line. Moreover, for example, the signal line is a common electrode line provided on the array substrate.

Next, the array substrate fabrication method according to the embodiments of the disclosure is described in detail by taking the signal line being the gate electrode of the thin film transistor as an example. For example, the array substrate fabrication method comprises the following steps.

Step 1: forming a gate electrode 22 on a base substrate 21 (for example, a glass substrate).

Figure 2:
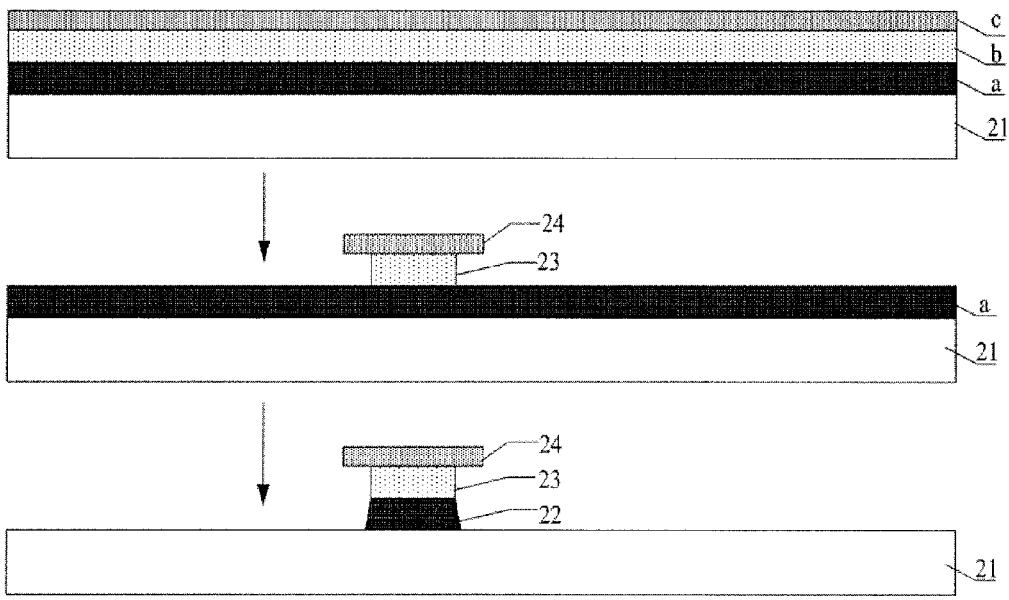
FIG. 2 is a schematic view illustrating forming a gate electrode on a base substrate in an array substrate fabrication method according to embodiments of the disclosure.

The detailed fabrication process of the gate electrode 22 is shown in FIG. 2 and comprises the following steps.

1) depositing a metal layer a for example formed of molybdenum (Mo) or chromium (Cr) on the base substrate 21, then sequentially depositing a material layer (e.g. a silicon oxide ($SiO_x$) layer b) for forming a first barrier layer and a material layer (e.g. a silicon nitride ($SIN_x$) layer c) for forming a second barrier layer.

For example, a stress existing in the $SiO_x$ layer b and a stress existing in the $SiN_x$ layer c are opposite to each other. For example, a tensile stress is applied to the base substrate by the $SiO_x$ layer b, a compression stress is applied to the base substrate by the $SiN_x$ layer c, and the tensile stress and the compression stress counteract each other, thus a deformation probability of the base substrate during the deposition process is reduced.

2) Applying a photoresist on the $SiN_x$ layer c, and performing exposure and development using a normal mask for forming the gate electrode; then performing a dry etching process to form the first barrier layer 23 and the second barrier layer 24;

Under a same dry etching condition, a lateral etching speed of the $SiO_x$ layer b for forming the first barrier layer is greater than a lateral etching speed of the $SiN_x$ layer c for forming the second barrier layer. So, the first barrier layer formed of $SiO_x$ is recessed to exhibit a drilling etching phenomenon. In this way, more surface of the metal layer a for forming the gate electrode is exposed, so that a width of the gate electrode is easily reduced. Meanwhile, since the dry etching process has a higher accuracy, the exposed amount of the surface of the metal layer a for forming the gate electrode is better controlled and thus the width of the gate electrode is better controlled.

It should be noted that, under the same dry etching condition, the lateral etching speed of the material layer for forming the first barrier layer must be greater than the lateral etching speed of the material layer for forming the second barrier layer, because the drilling etching phenomenon is exhibited and more surface of the metal layer a for forming the gate electrode is exposed only in such case. Meanwhile, since the $SiO_x$ layer deposited on the metal layer a for forming the gate electrode has a good adhesion, the $SiO_x$ layer will effectively protect the gate electrode even if an over-etching occurs in subsequent processes.

If the material for forming the first barrier layer and the material for forming the second barrier layer are interchanged, the drilling etching phenomenon will not occur and a recession will not be formed at the first barrier layer, so that more surface of the metal layer a for forming the gate electrode are not exposed and the width of the gate electrode is not reduced.

If the first barrier layer and the second barrier layer are made from the same material, the drilling etching phenomenon will not occur as well, so that more surface of the metal layer a for forming the gate electrode are not exposed and the width of the gate electrode is not reduced.

3) Performing a wet etching process to etch away the exposed metal layer a and obtain the gate electrode 22 with a reduced width.

Since the width of the gate electrode 22 is reduced, an overlapping portion between the gate electrode 22 and a source electrode 27 and a drain electrode 28 is eliminated or reduced, a coupling capacitance between the gate electrode and the source and drain electrodes is reduced, and a response time of the thin film transistor is shortened. In addition, since the width of the gate electrode 22 is reduced, an aperture ratio of the array substrate is increased, a transmittance of light from a backlight is increased, and a brightness of the display device is improved.

Moreover, since the gate electrode 22 is formed by using the normal mask, the fabrication cost is not increased.

Figure 3:
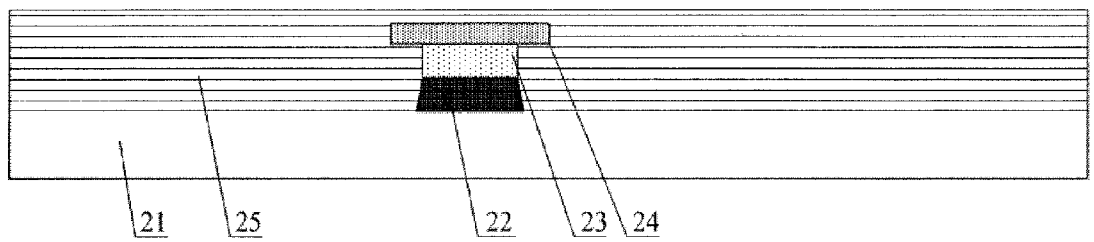
FIG. 3 is a schematic view illustrating forming a gate insulation layer on the gate electrode in the array substrate fabrication method according to the embodiments of the disclosure.

Step 2: forming a gate insulation layer 25 on the second barrier layer 24, as shown in FIG. 3.

For example, a spin coating process is used to coat a resin layer on the second barrier layer, so as to obtain the planarized gate insulation layer 25. Alternatively, the gate insulation layer 25 is made from silicon nitride or silicon oxide. Compared with the resin layer, silicon nitride and silicon oxide do not easily form the planarized layer. In addition, a gate capacitance formed between the gate electrode 22 and the active layer 26 (which is formed later) is adjusted by adjusting the thickness of the gate insulation layer 25 and selecting the material for forming the gate insulation layer 25. The greater the gate capacitance is, the easier the thin film transistor is driven to obtain a low on-state voltage and a high on-state current.

A relative dielectric constant of $SiO_x$ is 3~4, a relative dielectric constant of $SiN_x$ is 3~5, whereas a relative dielectric constant of the resin layer for forming the gate insulation layer is 10 or more. Since the gate capacitance is proportional to the relative dielectric constant of the gate insulation layer, the rein layer will effectively increase the gate capacitance. Accordingly, the drawbacks which are caused by increasing the gate capacitance merely by reducing the thickness of the gate insulation layer are avoided and the problem that the gate insulation layer is easily broken-down due to its excessively small thickness is solved.

Figure 4:
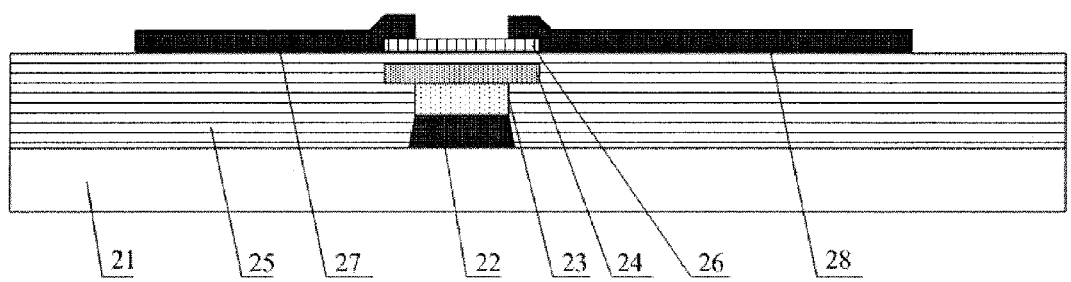
FIG. 4 is a schematic view illustrating forming a source electrode, a drain electrode and an active layer on the gate insulation layer in the array substrate fabrication method according to the embodiments of the disclosure.

Step 3: depositing a semiconductor thin film, a doped semiconductor film and a source-drain metal film on the gate insulation layer 25, and forming an active layer 26, the source electrode 27 and the drain electrode 28 on the gate insulation layer 25 through a patterning process using a half-tone mask or a gray-tone mask, as shown in FIG. 4.

Step 4: forming a passivation layer 29 on the active layer 26, the source electrode 27 and the drain electrode 28, and forming a via-hole in the passivation layer 29.

Figure 5:
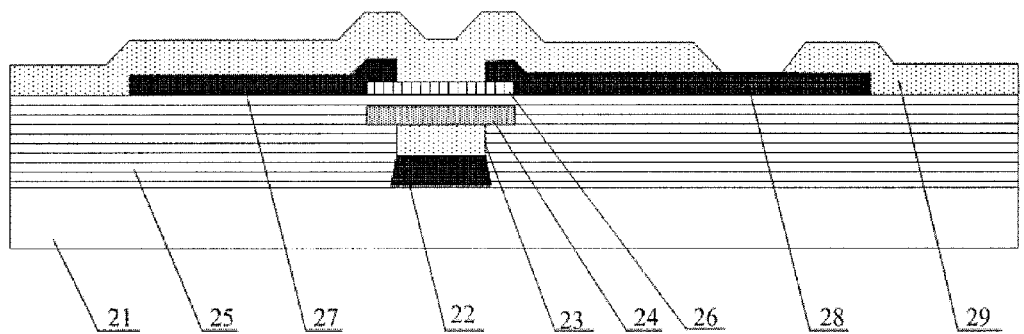
FIG. 5 is a schematic view illustrating forming a passivation layer on the source electrode and the drain electrode in the array substrate fabrication method according to the embodiments of the disclosure.

For example, a silicon nitride film is deposited on the active layer 26, the source electrode 27 and the drain electrode 28 by a Plasma Enhanced Chemical Vapor Deposition (PECVD) method, and the silicon nitride film is patterned by using a normal mask to obtain the via-hole, as shown in FIG. 5.

Step 5: forming a pixel electrode 210 on the passivation layer 29.

For example, a transparent conductive film formed of indium tin oxide (ITO) is deposited on the passivation layer 29 by a magnetron sputtering method, and the transparent conductive film is patterned by using a normal mask to form the pixel electrode 210. The pixel electrode 210 is connected to the drain electrode 28 of the thin film transistor through the via-hole in the passivation layer.

So far, the array substrate fabrication method according to the embodiments of the disclosure is completed.

Although the signal line fabrication process is described by taking the signal line being the gate electrode of the thin film transistor as an example in the above description, the signal line fabrication process is applicable to form a gate line, a data line and/or a common electrode line on the array substrate as well. In the case that the signal line fabrication process is used to form the gate line, the data line and/or the common electrode line on the array substrate, the widths thereof are reduced. Thus, the aperture ratio of the array substrate is increased, the transmittance of light from the backlight is increased, and the brightness of the display device is improved.

Embodiments of the disclosure further provide an array substrate, the array substrate comprises: a signal line, a first barrier layer provided on the signal line and a second barrier layer provided on the first barrier layer. When viewed from a plane where the array substrate is provided, the signal line and the first barrier layer are recessed relative to the second barrier layer.

The array substrate further comprises a thin film transistor, a gate line and a data line, the thin film transistor is provided at an intersection of the gate line and the data line. For example, the signal line is a gate electrode of the thin film transistor, the gate line or the data line. Moreover, for example, the signal line is a common electrode line provided on the array substrate.

For example, under a same etching condition, a lateral etching speed of a material layer for forming the first barrier layer is greater than a lateral etching speed of a material layer for forming the second barrier layer, so that the first barrier layer is recessed relative to the second barrier layer.

For example, a stress existing in the first barrier layer and a stress existing in the second barrier layer are opposite to each other.

For example, the first barrier layer is formed of $SiO_x$, and the second barrier layer is formed of $SiN_x$.

For example, a width of the signal line is 2~2.5 μm, and in such width range, the signal line is thin enough and is not easily broken.

Next, the array substrate according to embodiments of the disclosure is described in detail by taking the gate signal line being the gate electrode of the thin film transistor as an example.

Figure 6:
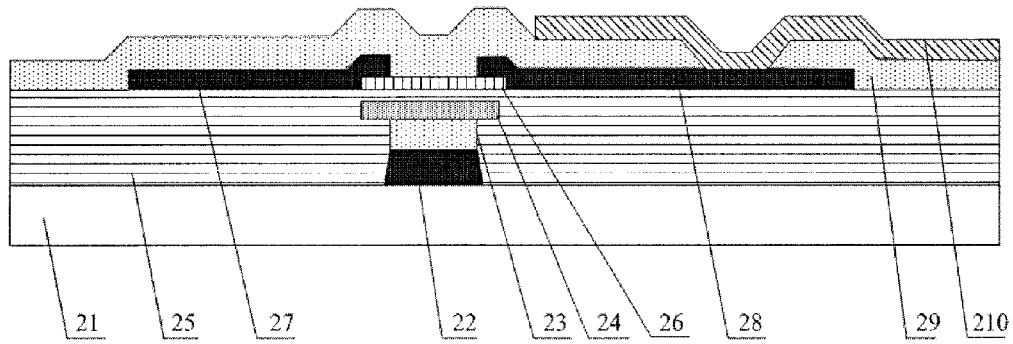
FIG. 6 is a structural schematic view illustrating an array substrate according to embodiments of the disclosure.

Referring to FIG. 6, the array substrate according to the embodiments of the disclosure comprises from bottom to top: a base substrate 21, the gate electrode 22, the first barrier layer 23, the second barrier layer 24, a gate insulation layer 25, an active layer 26, a source electrode 27, a drain electrode 28, a passivation layer 29 and a pixel electrode 210.

The gate electrode 22, the first barrier layer 23, the second barrier layer 24, the gate insulation layer 25, the active layer 26, the source electrode 27 and the drain electrode 28 constitute the thin film transistor. The gate line is provided in a same layer as the gate electrode 22. The data line is disposed in a same layer as the source electrode 27 and the drain electrode 28.

The gate electrode 22 is provided on the base substrate 21. For example, the width of the gat electrode is 2~2.5 μm, and the gate electrode is formed of metals such as molybdenum (Mo) or chrome (Cr).

The first barrier layer 23 is provided on the gate electrode 22. For example, the first barrier layer 23 is formed of silicon oxide ($SiO_x$).

The second barrier layer 24 is provided on the first barrier layer 23 and below the gate insulation layer 25. For example, the second barrier layer 24 is formed of silicon nitride ($SiN_x$).

Under a same etching condition, a lateral etching speed of $SiO_x$ for forming the first barrier layer 23 is greater than a lateral etching speed of $SiN_x$ for forming the second barrier layer 24. Since the lateral etching speed of $SiO_x$ is greater, a recession is formed at the first barrier layer, i.e., a drilling etching phenomenon is exhibited, and thus more surface of the gate electrode 22 is exposed. Meanwhile, since $SiO_x$ has a good adhesion, $SiO_x$ will effectively protect the gate electrode even if an over-etching occurs in subsequent processes.

The gate insulation layer 25 is provided on the second barrier layer 24 to insulate the gate electrode 22 from other electrodes.

The active layer 26 is provided on the gate insulation layer 25, and corresponds to the position of the second barrier layer 24.

The source electrode 27 is disposed on the active layer 26, and is provided on one side of the active layer 26.

The drain electrode 28 is disposed in a same layer as the source electrode 27, and is provided on the other side of the active layer 26.

For example, the source electrode 27 and the drain electrode 28 are formed of conductive metals, e.g., Mo, Cr, a combination of aluminum niobium alloy and molybdenum (AlNd/Mo) and the like.

The passivation layer 29 is provided on the source electrode 27 and the drain electrode 28. For example, the passivation layer 29 is formed of silicon nitride ($SiN_x$). A via-hole is formed in the passivation layer, through which the drain electrode 28 is connected with the pixel electrode 210.

The pixel electrode 210 is provided on the passivation layer 29. For example, the pixel electrode 210 is formed of a transparent conductive material such as ITO.

Embodiments of the disclosure further provide a display device, and the display device comprises the above-described array substrate.

According to the embodiments of the disclosure, the width of the signal line on the array substrate (for example, the signal line is the gate electrode of the thin film transistor, the gate line and/or the data line) is reduced, thereby the aperture ratio of the array substrate is increased, the transmittance of light from the backlight is increased, and the brightness of the display device is improved.

In the case that the signal line is the gate electrode of the thin film transistor, since the width of the gate electrode is reduced, the overlapping portion between the gate electrode and the source and drain electrodes is eliminated or reduced, the coupling capacitance between the gate electrode and the source and drain electrodes is reduced, and the response time of the thin film transistor is shortened.

Furthermore, in the case that the signal line is the gate electrode of the thin film transistor, since both the first barrier layer and the second barrier layer are formed with insulating materials, the thin film transistor have a multi-layer insulation structure. Thus, the gate capacitance is increased, the transmission speed of the thin film transistor is improved, and the channel properties of the thin film transistor are improved.

The foregoing embodiments merely are exemplary embodiments of the disclosure, and not intended to define the scope of the disclosure, and the scope of the disclosure is determined by the appended claims.

What is claimed is:

1. A signal line fabrication method, comprising:
   sequentially forming a material layer for forming the signal line, a material layer for forming a first barrier layer and a material layer for forming a second barrier layer;
   forming the first barrier layer and the second barrier layer by a patterning process; and
   forming the signal line by a patterning process,
   wherein a lateral etching speed of the material layer for forming the first barrier layer is greater than a lateral etching speed of the material layer for forming the second barrier layer.

2. The method according to claim 1, wherein the step of forming the firstbarrier layer and the second barrier layer by the patterning process comprises:
   etching the material layer for forming the first barrier layer and the material layer for forming the second barrier layer by a dry etching method.

3. The method according to claim 1, wherein the step of forming the signal line by the patterning process comprises:
   etching the material layer for forming the signal line by a wet etching method.

4. The method according to claim 1, wherein a stress existing in the first barrier layer and a stress existing in the second barrier layer are opposite to each other.

5. The method according to claim 1, wherein the first barrier layer is formed of silicon oxide, and the second barrier layer is formed of silicon nitride.

6. An array substrate fabricating method, comprising forming a signal line, wherein the signal line is formed by the signal line fabrication method according to claim 1.

7. The method according to claim 6, wherein the array substrate comprises a thin film transistor, a gate line and a data line, the thin film transistor is provided at an intersection of the gate line and the data line, and
   the signal line is a gate electrode of the thin film transistor, the gate line or the data line.

8. The method according to claim 6, wherein the array substrate further comprises a common electrode line, and the signal line is the common electrode line.

9. An array substrate, comprising a signal line, a first barrier layer provided on the signal line and a second barrier layer provided on the first barrier layer wherein the first barrier layer is configured to be formed in a first lateral etching speed of a material layer and the second barrier layer is configured to be formed in a second lateral etching speed of a material layer, the first lateral etching speed of the material layer is greater than the second lateral etching speed, such that the signal line and the first barrier layer are recessed relative to the second barrier layer when viewed from a plane where the array substate is provided.

10. The array substrate according to claim 9, wherein the array substrate comprises a thin film transistor, a gate line and a data line, the thin film transistor is provided at an intersection of the gate line and the data line, and
    the signal line is a gate electrode of the thin film transistor, the gate line or the data line.

11. The array substrate according to claim 10, wherein the array substrate further comprises a base substrate and a gate insulation layer, and
    in the case that the signal line is the gate electrode of the thin film transistor, the gate electrode is provided on the base substrate, the first barrier layer is provided on the gate electrode, the second barrier layer is provided on the first barrier layer and below the gate insulation layer.

12. The array substrate according to claim 9, wherein the array substrate further comprises a common electrode line, and the signal line is the common electrode line.

13. The thin film transistor according to claim 9, wherein the first barrier layer is formed of silicon oxide, and the second barrier layer is formed of silicon nitride.

14. The array substrate according to claim 9, wherein a width of the signal line is 2~2.5 µm.

15. The array substrate according to claim 9, wherein a stress existing in the first barrier layer and a stress existing in the second barrier layer are opposite to each other.

16. A signal line fabricating method, comprising;
    sequentiallty forming a material layer for forming the signal line, a material layer for forming a first barrier layer and a material layer for forming a second barrier layer;
    forming the first barrier layer and the second barrier layer by etching the material layer for forming the first barrier layer and the material layer for forming the second barrier layer by a dry etching process; and
    under a same condition of the dry etching process, a lateral etching speed of the material layer for forming the first barrier layer is greater than a lateral etching speed of the material layer for forming the second barrier layer to allow the first barrier layer being recessed to increase an exposed area of the signal line; and
    forming the signal line by a patterning process.

17. The method according to claim 16, wherein forming of the signal line by the patterning process comprises;
    etching the material layer for forming the signal line by a wet etching method.

18. The method according to claim 16, wherein a stress existing in the first barrier layer and a stress existing in the second barrier layer are opposite to each other.

19. The method according to claim 16, wherein the first barrier layer is formed of silicon oxide, and the second barrier layer is formed of silicon nitride.

* * * * *